(12) United States Patent
Roessler et al.

(10) Patent No.: US 6,246,016 B1
(45) Date of Patent: Jun. 12, 2001

(54) EDGE-MOUNTABLE INTEGRATED CIRCUIT PACKAGE AND METHOD OF ATTACHING THE SAME TO A PRINTED WIRING BOARD

(75) Inventors: Robert J. Roessler, Rowlett; William L. Woods, Jr., Kaufman, both of TX (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/266,531

(22) Filed: Mar. 11, 1999

(51) Int. Cl.[7] .................................................... H01R 9/09
(52) U.S. Cl. ......................... 174/261; 361/729; 361/784
(58) Field of Search .................................. 174/260, 261; 301/784, 807; 361/729; 257/727, 724; 439/65

(56) References Cited

U.S. PATENT DOCUMENTS

| | | | |
|---|---|---|---|
| 5,031,072 | * 7/1991 | Malhi et al. | 361/729 |
| 5,260,601 | * 11/1993 | Baudouin et al. | 361/807 |
| 5,545,924 | * 8/1996 | Contolatis et al. | 257/724 |
| 5,629,839 | * 5/1997 | Woychik | 361/784 |

OTHER PUBLICATIONS

U.S. application No. 08/940,557, Filed Sep. 30, 1997, Pitzele 7–2, "Power Magnetic Device Employing A Leadless Connection to a Printed Circuit Board and Method Of Manufacture Thereof" Robert J. Roessler and Lennart D. Pitzele.

* cited by examiner

Primary Examiner—Albert W. Paladini

(57) ABSTRACT

An edge-mountable integrated circuit (IC) package and methods of manufacturing and assembling the same onto a printed wiring board (PWB). In one embodiment, the package includes: (1) a substrate having a major surface and a substantially planar edge and (2) a conductive coating having a first region located on a portion of the major surface and a second region located on a portion of the substantially planar edge, the second region being substantially planar to allow the second region to be reflow soldered to the adjoining printed wiring board PWB.

23 Claims, 4 Drawing Sheets

EDGE-MOUNTABLE INTEGRATED CIRCUIT PACKAGE AND METHOD OF ATTACHING THE SAME TO A PRINTED WIRING BOARD

TECHNICAL FIELD OF THE INVENTION

The present invention is directed, in general, to mounting techniques for electronic components and, more specifically, to an edge-mountable integrated circuit (IC) package and method of attaching the same to a printed wiring board (PWB).

BACKGROUND OF THE INVENTION

The burgeoning electronics industry has been driven by consumer and commercial needs for more and more complex electronic assemblies in ever smaller spaces. With the conversion from vacuum tubes to integrated circuits, electronics transitioned from individual hand-wired components on a major chassis to printed wiring board (PWB) assemblies with integrated circuit subassemblies thereon. In the early days of electronics, virtually all of the electronic parts were interconnected by wires routed primarily on the underside of the chassis. As transistors, and then integrated circuits, came into widespread use, it became possible to group major electronic functions together on designated areas of the chassis. The chassis evolved to a "motherboard" when it became possible to move some functions to smaller PWBs or "daughterboards." The terms "motherboard" and "daughterboard" in this context are not limited to computer applications but include any electronic devices with PWBs that function in the general manner described.

PWB assemblies comprise a substantially flat, rectangular package having two parallel major surfaces and a number of minor surfaces, or edges, normal to the major surfaces. The major and minor surfaces are designated as such to indicate that a surface area of the major surface is greater than a surface area of the minor surface. Arbitrarily for the sake of this discussion, motherboards are considered to be mounted horizontally; however daughterboards, may mount horizontally or vertically. Of course, there are applications where the motherboard is vertical. Horizontal mounting places the major surfaces of the motherboard and daughterboard substantially parallel. Vertical mounting places the major surface of the daughterboard normal to the major surface of the motherboard. Vertical mounting also allows designers to package more electronics into less area of the motherboard, thereby reducing the overall footprint of the electronic devices. Therefore, some means of mechanically attaching and electrically interconnecting the PWB subassemblies/ daughterboards to the motherboard is extremely important. Interconnecting the daughterboards for removable/ replaceable functions, such as a modem, video card, disk drive controllers, etc., is usually accomplished by edge card connectors with friction fit contacts spaced 0.1" apart on center. Some daughterboard functional subassemblies, however, are essential to the overall function of the electronic device and therefore require permanent connection to the motherboard. Traditionally, permanently installed, single in-line packages (SIPs) are electrically connected to the motherboard with either plug connectors or edge card connectors that can be reflow soldered to the motherboard. Alternatively, electrical connections between the daughterboard and the motherboard may be accomplished with wire when the boards are mechanically coupled without electrical interconnnections. Of course, plug connectors, edge card connectors and wire connections add to the complexity and cost of the total assembly. Both of these techniques are expensive and have the additional disadvantage of unwanted inductance upon assembly.

Accordingly, what is needed in the art is an edge-mountable integrated circuit package and a method of attaching the package to a printed wiring board that minimizes both inductance, space and cost.

SUMMARY OF THE INVENTION

To address the above-discussed deficiencies of the prior art, the present invention provides an edge-mountable integrated circuit (IC) package and methods of manufacturing and assembling the same onto a printed wiring board (PWB). In one embodiment, the package includes: (1) a substrate having a major surface and a substantially planar edge and (2) a conductive coating having a first region located on a portion of the major surface and a second region located on a portion of the substantially planar edge, the second region being substantially planar to allow the second region to be reflow soldered to the adjoining printed wiring board PWB.

The present invention therefore avoids the edge connectors and wire bonds of the prior art, allowing a substrate to be joined edge-on directly to a PWB. The present invention is effected by providing a conductive coating on the edge of the substrate, which then can be used in an otherwise conventional solder reflow process to join the substrate to the PWB.

In one embodiment of the present invention, the package further includes a second conductive coating having a first region located on a second portion of the major surface and a second region located on a second portion of the substantially planar edge, the second region of the second conductive coating being substantially planar to allow the second region to be concurrently reflow soldered to the adjoining PWB. Thus, a single edge can accommodate more than one region (terminal). In one embodiment to be illustrated and described, the second region extends over less than half a width of the substantially planar edge, allowing conductive coatings to be placed in tandem along the length of the substantially planar edge. Each conductive coating can be routed to its respective adjacent major surface, effectively doubling the number of terminals that the package is allowed to have. Of course, tandem location need not be provided.

In one embodiment of the present invention, the substrate is composed of a resin-impregnated glass fiber. However, other conventional and later-discovered substrate materials that are capable of accommodating a conductive coating are within the broad scope of the present invention.

In one embodiment of the present invention, the first region comprises a conductive trace. Thus, the coating may be coupled to, or form a part of, a conventional surface or inter-layer trace for conducting current along or under the major surface.

In one embodiment of the present invention, the package further includes first and second extensions projecting from the substantially planar edge and adapted to engage corresponding first and second apertures in the PWB. In a more specific embodiment of the present invention, the package further includes the PWB and wherein the first and second apertures have an offset periphery to impress a bending moment on the substrate when the first and second extensions are engaged in the corresponding apertures. In an embodiment to be illustrated and described, the apertures may be formed by a rotating tool having a diameter exceeding the thickness of the substrate. The apertures can be employed to place the substrate in a bind, frictionally securing the substrate to the PWB pending reflow soldering.

In one embodiment of the present invention, the substantially planar edge contains first and second notches. The first notch is located proximate a first edge of the conductive coating. The second notch is located proximate a second edge of the conductive coating. The notches ensure that the substantially planar edge having the conductive coating stands out such that it can contact the PWB. This is advantageous if the PWB is not absolutely planar.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
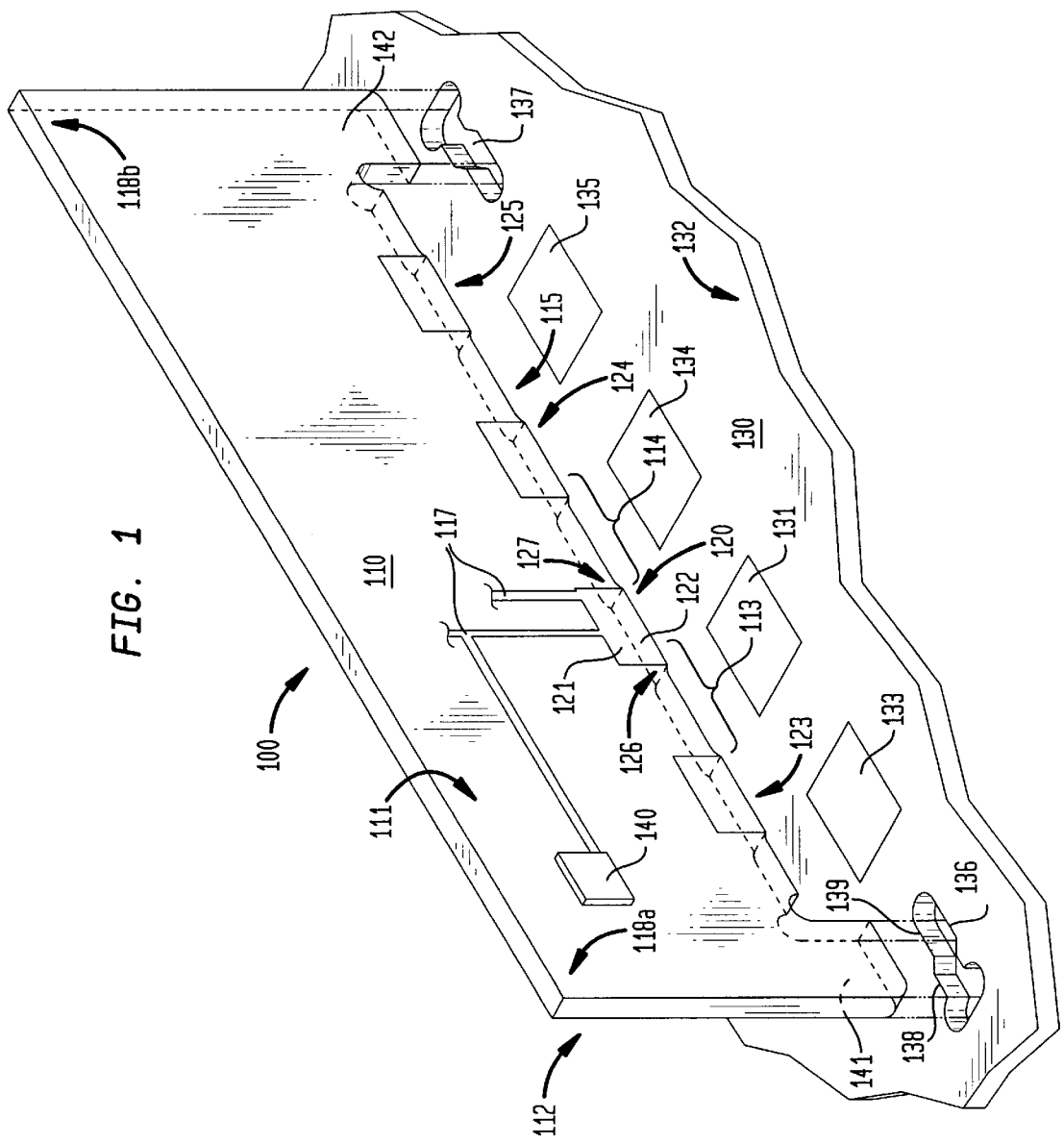
FIG. 1 illustrates an isometric view of one embodiment of an edge-mountable integrated circuit package constructed according to the principles of the present invention.

Referring initially to FIG. 1, illustrated is an isometric view of one embodiment of an edge-mountable integrated circuit package constructed according to the principles of the present invention. An edge-mountable integrated circuit package, generally designated 100, comprises a substrate 110 and a conductive coating 120. In one advantageous embodiment, the substrate 110 may be constructed of a resin-impregnated glass fiber; however, one who is skilled in the art will recognize that other similar materials may also be used. The substrate 110 has two, essentially parallel, major surfaces 111, 112 and a substantially planar edge 115 normal to the major surfaces 111, 112. The conductive coating 120 may include a first major surface component or first region 121 located on a portion of the major surface 111, and an edge component or second region 122 located on a portion of the edge 115. The first region 121 and the second region 122 are contiguous so as to be electrically conductive. Connected to the first region 121 are conductive traces 117 that provide an electrical pathway for current from the conductive coating 120 to electronic components 140 mounted on the substrate 110. One who is skilled in the art is familiar with the conventional processes used to form conductive coatings 120, 117 on the substrate 110. The second region 122 is shown proximate a conductive region 131 on a surface 132 of a motherboard 130. Of course, multiple conductive coatings 123, 124, 125 may be formed on the substrate 110 as required for a particular application to mate with corresponding conductive regions 133, 134, 135.

In one embodiment, the edge-mountable integrated circuit package 100 may further comprise first and second notches 113, 114 located in the substantially planar edge 115. The first notch 113 is located proximate a first edge 126 of the conductive coating 120 and the second notch is located proximate a second edge 127 of the conductive coating 120. Contact between the second region 122 and the conductive region 131 is assured by notching the substantially planar edge 115 as shown.

In another embodiment, the edge-mountable integrated circuit package 100 may further comprise first and second extensions 141, 142 projecting from the planar edge 115. Of course, any number of extensions may be provided to advantage. The first and second extensions 141, 142 are adapted to engage corresponding first and second apertures 136, 137 in the motherboard 130. In one advantageous embodiment, the first and second apertures 136, 137 have an offset periphery 138, 139 that impresses a bending moment 118a, 118b on the substrate 110 when the first and second extensions 141, 142 are inserted into the corresponding apertures 136, 137. This bending moment 118a, 118b holds the integrated circuit package 100 in proper alignment with the motherboard 130 during reflow soldering of the second region 122 to the conductive region 131.

To effect an electrical connection, the edge-mountable integrated circuit package 100 is mechanically installed on the motherboard 130 with the first and second extensions 141, 142 engaging the first and second apertures 136, 137. The edge-mountable integrated circuit package 100 and the motherboard 130 are then reflow soldered in a conventional manner forming an electrical connection between the second region 122 and the conductive region 131. One who is skilled in the art is familiar with reflow soldering.

Figure 2:
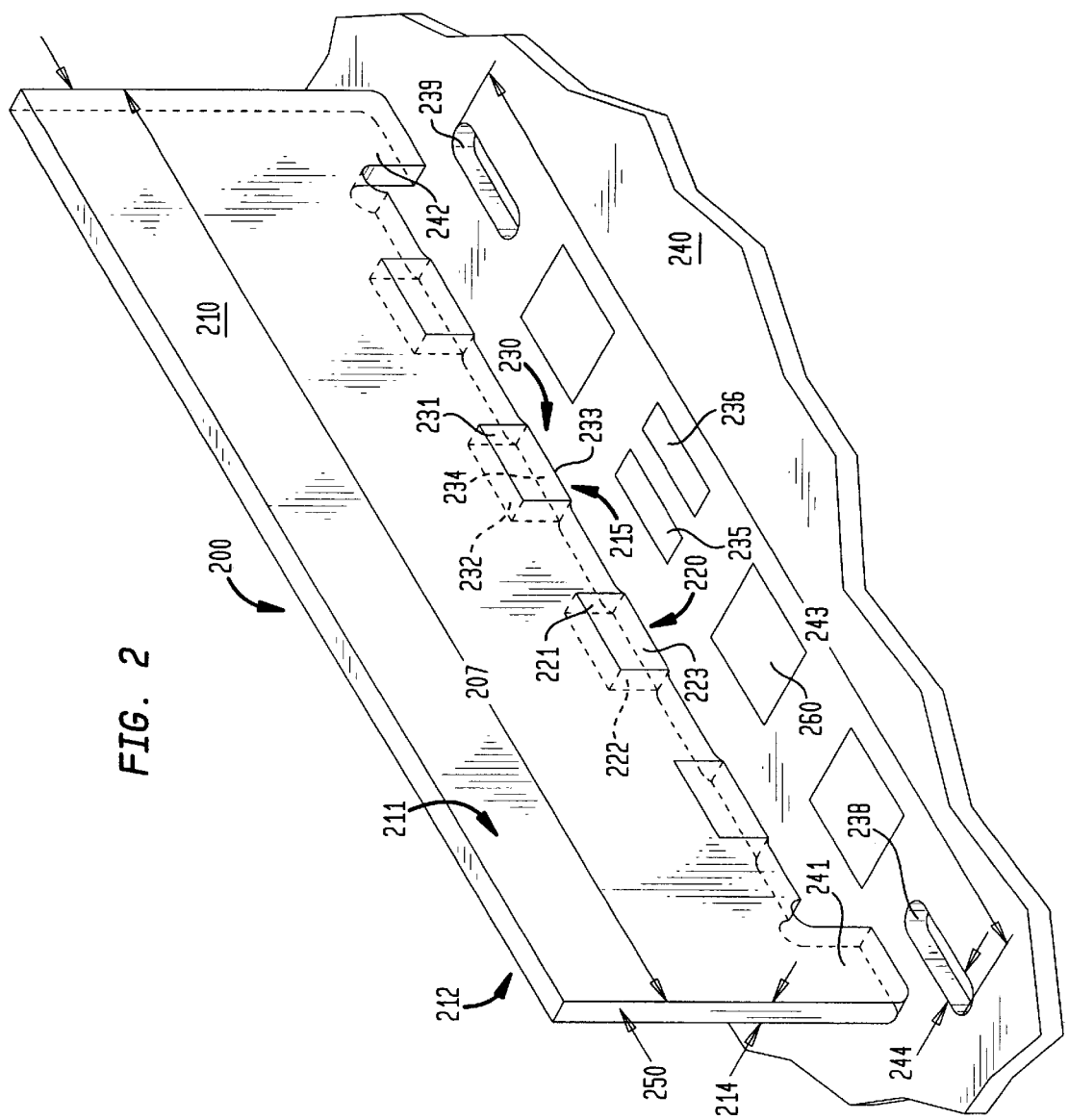
FIG. 2 illustrates two alternative embodiments of the conductive coating 120 of FIG. 1.

Referring now to FIG. 2, illustrated are two alternative embodiments of the conductive coating 120 of FIG. 1. In this embodiment, an edge-mountable integrated circuit package 200 comprises a substrate 210, a first conductive coating 220 and a second conductive coating 230. The first conductive coating 220 has first and second conductive surface components 221, 222 and a common conductive edge component 223. Conductive surface component 221 is located on a portion of a first major surface 211, while second conductive surface component 222 is located on a portion of a second major surface 212. The first and second conductive surface components 221, 222 share the common conductive edge component 223 as shown. In this embodiment, electrical traces (not shown) similar to the electrical traces 117 of FIG. 1 may be formed on both the first and second major surfaces 211, 212 as required. The common conductive edge component 223 is shown proximate its mating conductive region 260.

In an alternative embodiment, the second conductive coating 230 similarly comprises first and second conductive surface components 231, 232 on the first major surface 211 and second major surface 212, respectively. However, in this embodiment, two edge components 233, 234 have been formed. Each edge component 233, 234 extends over less than half a width of an edge 215 of the substrate 210. Thus, edge components 233, 234 may be coupled simultaneously through reflow soldering with corresponding conductive regions 235, 236, respectively, on a motherboard 240.

In another embodiment, alternative apertures 238, 239 may be oblong in shape and cut to a width 244 that is slightly less than a thickness 214 of the substrate 210. Thus, a friction fit between the alternative apertures 238, 239 and first and second extensions 241, 242 holds the package 200 securely to the motherboard 240 during reflow soldering.

In an alternative embodiment, the substrate 210 may be manufactured to an overall length 207 such that the overall length 207 and a distance 243 between the first and second apertures 238, 239 will cooperate to create a slight compressive force 250 on the integrated circuit package 200 when the package 200 is installed in the motherboard 240. This compressive force 250 holds the integrated circuit package 200 in proper alignment with the motherboard 240, and the common conductive edge component 223 in contact with conductive region 260 and edge components 233, 234 in contact with corresponding conductive regions 235, 236 during reflow soldering.

Figure 3:
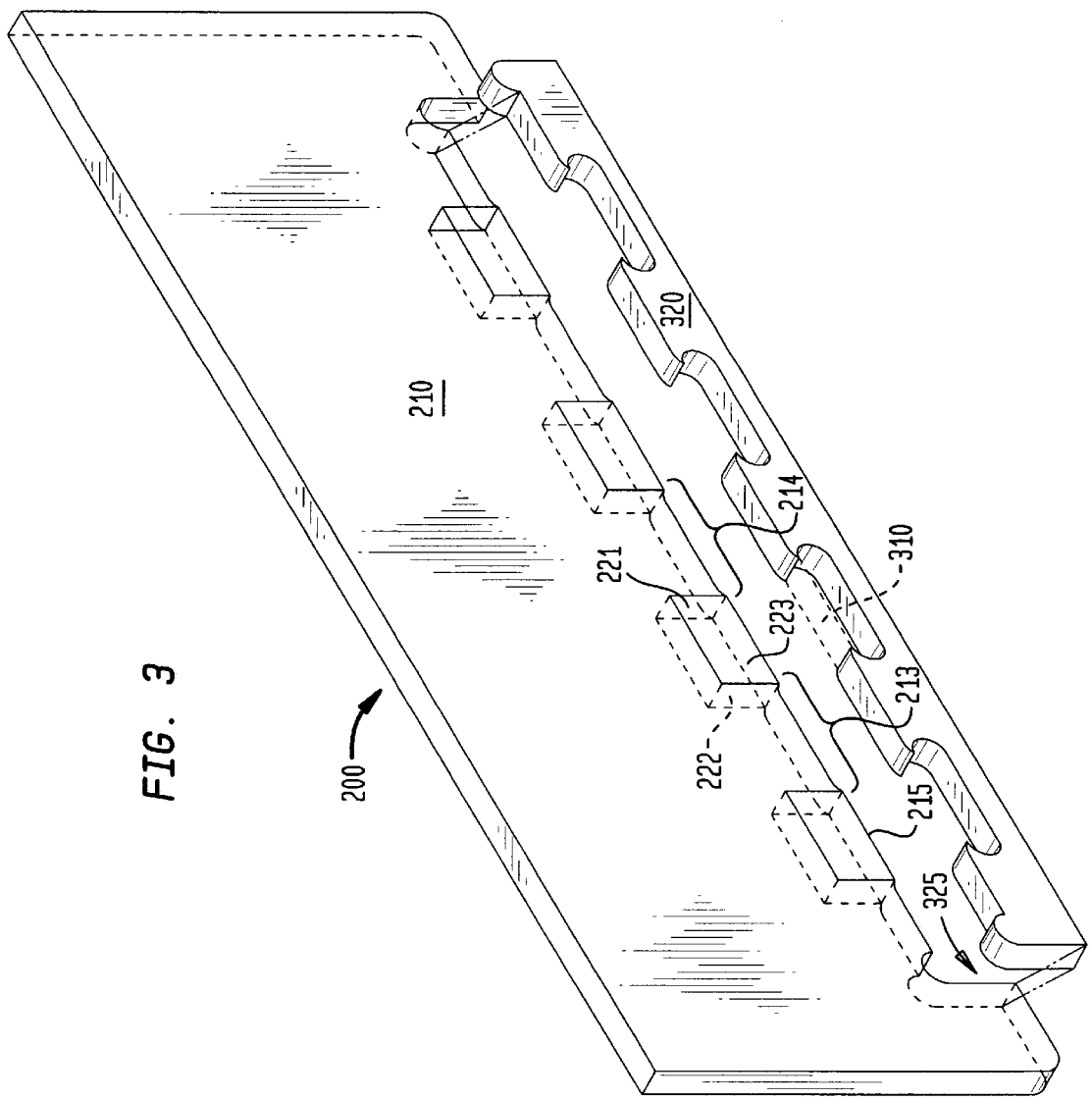
FIG. 3 illustrates an exploded view of the edge-mountable integrated circuit package of FIG. 2 during manufacture.

Referring now to FIG. 3, illustrated is an exploded view of the edge-mountable integrated circuit package of FIG. 2 during manufacture. The common conductive edge component 223 may be formed on the substrate 210 by forming an aperture 310 through the substrate 210. The first and second conductive surface components 221, 222 and the common conductive edge component 223 are formed simultaneously by plating. Excess material 320 is then cut from the edge-mountable integrated circuit package 200 along cut line 325 forming the substantially planar edge 215 and first and second notches 213, 214.

Figure 4:
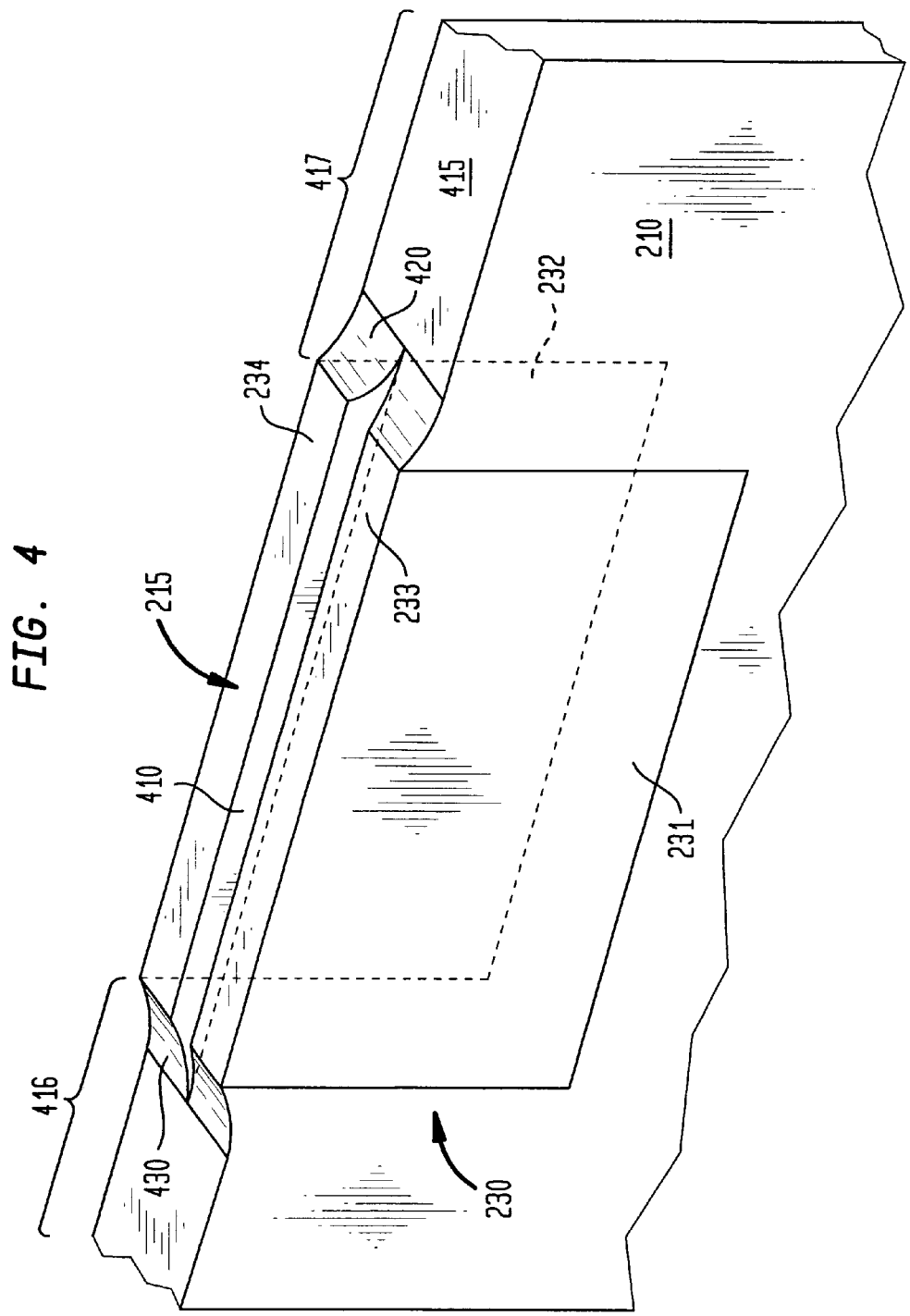
FIG. 4 illustrates an enlarged inverted view of the second embodiment of FIG. 2.

Referring now to FIG. 4, illustrated is an enlarged inverted view of the second embodiment of FIG. 2. Shown is the second conductive coating 230 comprising the first and second conductive surface components 231, 232 and the two edge components 233, 234. The two edge components 233, 234 are separated by a kerf 410 in the edge 215 of the substrate 210. Also shown is an edge 415 of the substrate 210 having first and second notches 416, 417 with arcuate portions 420, 430 that allow the edge components 233, 234 to extend slightly so as to assure a positive contact with the conductive regions 235, 236 of FIG. 2. The shape of portions 420, 430, may also be a decline, or any other shape that is readily manufacturable and suitable for providing clearance between the substrate edge 415 and the surface 132 of the motherboard 130.

From the above, it is apparent that the present invention provides an edge-mountable IC package and methods of manufacturing and assembling the same onto a PWB. In one embodiment, the package includes: (1) a substrate having a major surface and a substantially planar edge and (2) a conductive coating having a first region located on a portion of the major surface and a second region located on a portion of the substantially planar edge, the second region being substantially planar to allow the second region to be reflow soldered to the adjoining printed wiring board PWB.

Although the present invention has been described in detail, those skilled in the art should understand that they can make various changes, substitutions and alterations herein without departing from the spirit and scope of the invention in its broadest form.

What is claimed is:

1. An edge-mountable integrated circuit (IC) package, comprising:
   a substrate having a major surface and a substantially planar edge; and
   a conductive coating having a first region located on a portion of said major surface and a second region located on a portion of said substantially planar edge, said second region being substantially planar to allow said second region to be reflow soldered to an adjoining printed wiring board (PWB).

2. The package as recited in claim 1 further comprising a second conductive coating having a first region located on a second portion of said major surface and a second region located on a second portion of said substantially planar edge, said second region of said second conductive coating being substantially planar to allow said second region of said second conductive coating to be concurrently reflow soldered to said adjoining PWB.

3. The package as recited in claim 1 wherein said second region extends over less than half a width of said substantially planar edge.

4. The package as recited in claim 1 wherein said substrate is composed of a resin-impregnated glass fiber.

5. The package as recited in claim 1 wherein said first region comprises a conductive trace.

6. The package as recited in claim 1 further comprising first and second extensions projecting from said substantially planar edge and adapted to engage corresponding first and second apertures in said PWB.

7. The package as recited in claim 6 further comprising said PWB and wherein said first and second apertures have an offset periphery to impress a bending moment on said substrate when said first and second extensions are engaged in said corresponding apertures.

8. The package as recited in claim 1 wherein said substantially planar edge contains first and second notches, said first notch located proximate a first edge of said conductive coating and said second notch located proximate a second edge of said conductive coating.

9. A method of manufacturing an edge-mountable integrated circuit (IC) package, comprising:
   providing a substrate having a major surface and a substantially planar edge; and
   creating a conductive coating having a first region located on a portion of said major surface and a second region located on a portion of said substantially planar edge, said second region being substantially planar to allow said second region to be reflow soldered to an adjoining printed wiring board (PWB).

10. The method as recited in claim 9 further comprising creating a second conductive coating having a first region located on a second portion of said major surface and a second region located on a second portion of said substantially planar edge, said second region of said second conductive coating being substantially planar to allow said second region of said second conductive coating to be concurrently reflow soldered to said adjoining PWB.

11. The method as recited in claim 9 wherein said second region extends over less than half a width of said substantially planar edge.

12. The method as recited in claim 9 wherein said substrate is composed of a resin-impregnated glass fiber.

13. The method as recited in claim 9 wherein said creating comprises forming an aperture in said substrate, coating an interior surface of said aperture with said conductive coating and cutting said substrate to cause a portion of said aperture to form said substantially planar edge.

14. The method as recited in claim 9 further comprising forming first and second extensions projecting from said substantially planar edge and adapted to engage corresponding first and second apertures in said PWB.

15. The method as recited in claim 14 further comprising coupling said PWB and said package and wherein said first and second apertures have an offset periphery to impress a bending moment on said substrate when said first and second extensions are engaged in said corresponding apertures.

16. The method as recited in claim 9 further comprising forming first and second notches in said substantially planar edge, said first notch located proximate a first edge of said conductive coating and said second notch located proximate a second edge of said conductive coating.

17. A method of mounting an edge-mountable integrated circuit (IC) package to a printed wiring board, comprising:

providing a substrate having a major surface and a substantially planar edge and a conductive coating having a first region located on a portion of said major surface and a second region located on a portion of said substantially planar edge;

placing said second region directly in contact with a bonding pad on said PWB; and reflow soldering said second region to said bonding pad.

18. The method as recited in claim 17 wherein said package further has a second conductive coating having a first region located on a second portion of said major surface and a second region located on a second portion of said substantially planar edge, said method further comprising concurrently reflow soldering said second region of said second conductive coating to said adjoining PWB.

19. The method as recited in claim 17 wherein said second region extends over less than half a width of said substantially planar edge.

20. The method as recited in claim 17 wherein said substrate is composed of a resin-impregnated glass fiber.

21. The method as recited in claim 17 wherein said first region comprises a conductive trace.

22. The method as recited in claim 17 further comprising engaging first and second extensions projecting from said substantially planar edge into corresponding first and second apertures in said PWB.

23. The method as recited in claim 22 further comprising impressing a bending moment on said substrate when said first and second extensions are engaged in said corresponding apertures.

* * * * *